United States Patent [19]

Legge

[11] Patent Number: 5,030,617
[45] Date of Patent: Jul. 9, 1991

[54] ELECTRICALLY SWITCHED SUPERCONDUCTORS

[75] Inventor: Ronald Legge, Scottsdale, Ariz.

[73] Assignee: Motorola, Inc., Schaumburg, Ill.

[21] Appl. No.: 355,524

[22] Filed: May 23, 1989

[51] Int. Cl.$^5$ .................... H01L 45/00; H01L 39/22; H01B 12/00

[52] U.S. Cl. ......................................... 505/1; 357/4; 357/5

[58] Field of Search .................. 357/5, 4, 3; 505/701, 505/706, 1

[56] References Cited

U.S. PATENT DOCUMENTS

| | | |
|---|---|---|
| 4,334,158 | 6/1982 | Faris ........................................ 357/5 |
| 4,589,001 | 5/1986 | Sakai et al. .............................. 357/5 |
| 4,831,421 | 5/1989 | Gallagher et al. ....................... 357/5 |

FOREIGN PATENT DOCUMENTS 56141607 11/1981 Japan .

OTHER PUBLICATIONS

"Self-Heating Hotspots in Superconducting Thin-Film Microbrides", Skocpol et al, J. Appl. Phys., vol. 45, #9, Sep. 1974, pp. 4054-4066.

"Quasiparticle-Injection-Induced Superconducting Weak Lumps", Wong et al, Phys. Rev Lett, vol. 37, #3, Jul. 19, 1976, pp. 150-153.

"Solid State Physics", Kittel, 5th Edition, Wiley & Sons, 1976, pp. 112-113.

"Deposition of Superconducting Y-Ba-Cu-O Films at 400° C. without Post-Annealing", Witanachi et al, Appl. Phys. Lett., vol. 53, #3, Jul. 18, 1988, pp. 234-236.

Primary Examiner—Rolf Hille
Assistant Examiner—Mahshid Saadat
Attorney, Agent, or Firm—Joe E. Barbee

[57] ABSTRACT

An existing superconducting material is rendered non-superconducting without a change in temperature by the generation of phonons which breakup the electron pairing within the superconducting material. The phonons are generated by a piezoelectric film deposited on the superconducting material. A high frequency signal is used to energize the piezoelectric film resulting in piezoelectric acoustic phonon generation within the superconducting material.

10 Claims, 1 Drawing Sheet

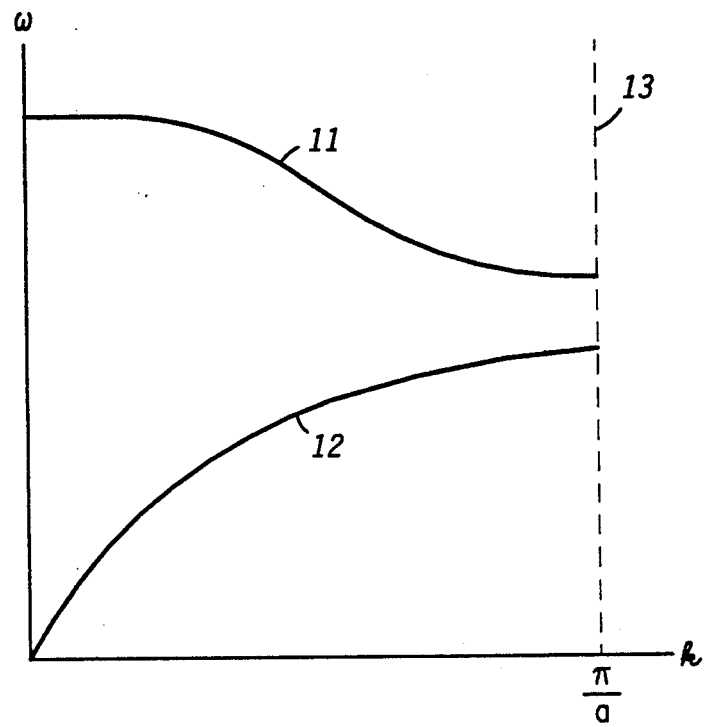
FIG. 1
FIG. 2
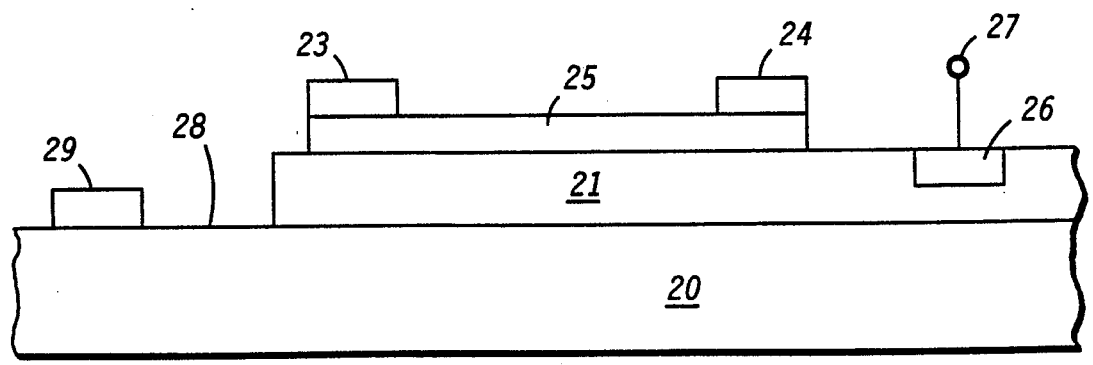

ELECTRICALLY SWITCHED SUPERCONDUCTORS

BACKGROUND OF THE INVENTION

This invention relates, in general, to superconductors, and more particularly, to an electrically switched superconductor.

Originally, superconductivity was confined to materials which required very low temperatures, e.g. less than 20° K. These materials were extensively studied, some are produced in commercial quantities, and a detailed theory was developed to explain the loss of electrical resistance that these materials exhibited. This theory is known as the BCS theory and won the Nobel prize. The BCS theory showed that phonons that somehow coupled themselves to electrons could cause a complete disappearance of resistance, as well as a number of other effects. A phonon is a vibrational wave in a solid, and it is viewed as a particle having an energy, a sort of momentum, and a wave length. Phonons come in two species, both of which have their own distinct range of energies, etc. Acoustic phonons are what carry heat and sound through a solid. They generally have lower energy and move at or below the speed of sound, i.e., the speed of sound in the solid. Optical phonons have somewhat higher energies, and generally do not overlap the energy range of acoustic phonons.

More recently, all of the same effects observed in the original superconductors have been observed in newly discovered ceramic superconductors which have a much higher transition temperature, that is, above 77° K. This temperature is high enough to permit conventional semiconductor circuits to function, and so permits semiconductor devices and superconductor films to be used together.

With the discovery of these superconductors it is apparent that it would be desirable to be able to electrically switch the superconductor to a non-superconductor without having to increase the temperature of the material.

Accordingly, it is an object of the present invention to provide means for electrically switching a superconductor without increasing the temperature of the superconductor.

Another object of the present invention is to rapidly switch a superconductor back and forth between being a superconductor and a non-superconductor.

A further object of the present invention is to be able to control superconducting properties at a high speed while using low power.

SUMMARY OF THE INVENTION

The above and other objects and advantages of the present invention are achieved by a piezoelectric material positioned on a superconductor material. When the piezoelectric material is electrically stimulated it will serve as a phonon generator to generate phonons in the superconductor material. This will electrically switch the superconductor to a non-superconductor.

BRIEF DESCRIPTION OF THE DRAWINGS

FIG. 1 illustrates a dispersion curve useful in understanding the present invention; and FIG. 2 illustrates an embodiment of the present invention.

DETAILED DESCRIPTION OF THE DRAWINGS

FIG. 1 illustrates a frequency versus wave number curve for two vibrational modes of a diatomic linear lattice. One vibrational mode is the optical mode and is illustrated by curve 11. The other vibrational mode is the acoustic mode and is illustrated by curve 12. Frequency which is proportional to energy is shown along the ordinate of the graph as $\omega$. The wave vector which is thought of as momentum is shown along the abscissa of the graph as k. The wave vector or number, k, is inversely proportional to phonon wavelength. Dotted line 13 represents the Brillouin zone boundary, which is $\pi/2a$, wherein a is the lattice constant or parameter. As indicated by curves 11 and 12 the energies associated with the two modes of vibration are, respectively, in the optical and acoustical range of the frequency spectrum. Therefore, an important distinction between the two types of phonons are that the optical phonons have higher energies, and there is an intermediate range of energies for which there are no phonons of either kind. This intermediate range occurs between curves 11 and 12. Another distinction is the way that the vibrations are excited. Optical phonons can be excited by photons, but acoustic phonons are generated by temperature, or electrically driven piezoelectric elements (sound waves). Both types of phonons can propagate through a solid and cause distortions in the arrangement of atoms or molecules. The fact that superconductivity is very temperature sensitive suggests that phonons are somehow crucial to the existence of zero resistance. High temperature, which means lots of phonons (as thermal vibrations), destroys superconductivity, yet some phonons are necessary at low temperatures for superconductivity to exist according to the BCS theory.

FIG. 2 illustrates an embodiment of the present invention which provides a phonon generator to generate phonons in a superconductor. The excess phonons generated will function as they do at high temperatures thereby destroying superconductivity. A substrate 20 has deposited thereon a thin film of a known superconductor material 21. Superconductor material 21 can be any suitable superconducting material such as $YBa_2Cu_3O_{7-x}$, or the like. A piezoelectric material 25 is then placed on at least a portion of superconductor 21. Piezoelectric material 25 can be a thin film, and if superconductor 21 is an optical device, piezoelectric material 25 is donut shape to provide an open area for the optical function. Piezoelectric material 25 is activated by two electrical terminals 23 and 24. Terminals or contacts 23 and 24 can be positioned on the surface of piezoelectric material 25, as illustrated, or can be embedded into piezoelectric material 25. One terminal is a ground or return whereas the other terminal is the signal terminal so that a high frequency signal can be applied to the piezoelectric structure to provide an acoustic phonon generator. The vibrations generated by the high frequency signal to the piezoelectric material generate controllable lattice vibrations (phonons) in superconductor material 21. An ohmic contact 26 is used to make electrical contact to superconductor 21. Ohmic contact 26 has a terminal 27. Note that a typical structure will have a plurality of ohmic contacts. Only one ohmic contact 26 has been illustrated to avoid overcrowding the drawing. It will be understood that the ohmic contacts to superconductor 21 can be placed either inside a patterned piezoelectric material 25 or outside of piezoelectric material 25. If superconductor 21 is being used as an optical device then a preferred embodiment would be for piezoelectric material 25 to surround the optical device.

FIG. 2 also shows an area 28 of substrate 20, which in this case is a semiconductor substrate. Area 28 is void of superconductor material 21. This permits conventional semiconductor devices to be built on or in substrate 20 having ohmic contacts such as illustrated by ohmic contact 29. As an example, a high frequency generator could be made in area 28 to serve as the frequency source for energizing piezoelectric material 25 through terminals 23 and 24 to switch superconductor 21 to non-superconducting.

It will be noted that piezoelectric material 25 can be on the surface of the superconductor material 21 as illustrated in FIG. 2 or can be planarized with the top surface of superconductor 21 as is ohmic contact 26. In a preferred embodiment, piezoelectric material 25 is a patterned piezoelectric film. Piezoelectric material 25 can be any suitable material such as gallium arsenide or the like.

The interaction between electrons and phonons which occurs at low temperatures in some elemental metals and also in high resistivity ceramics gives rise to superconductivity due to the lessening of the normal repulsive coulomb force between pairs of electrons. It is also responsible for the loss of superconductivity when the phonon energy becomes too large, i.e. when the temperature exceeds the transition temperature of the superconductor material. The present invention creates an excess of phonons by electrical stimulation through the use of a monolithically fabricated phonon generating device using the technique of piezoelectric acoustic phonon generation. This results in an electrically switched superconducting film for high speed, high frequency electronic applications. An existing superconducting material is made to become normal (non-superconducting) without a change in temperature by the generation of phonons which breakup the delicate electron-phonon-electron coupling responsible for superconductivity. The signal applied to piezoelectric material terminals 23 and 24 must be of a high frequency in order to generate the phonons in superconductor 21. However, the high frequency can be switched on and off at a lower frequency to produce a modulated signal. This technique of changing the properties of superconductivity requires low power since piezoelectric devices are efficient phonon generators and the phonon energy required is low.

What is claimed is:

1. An electrically switched superconductor comprising: a substrate; a superconductor material positioned on the substrate; and a patterned piezoelectric film positioned on the superconductor material to serve as a phonon generator to generate phonons in the superconductor material.

2. The electrically switched superconductor of claim 1 wherein the patterned piezoelectric film is patterned to have at least a return terminal and a terminal for receiving a predetermined signal.

3. The electrically switched superconductor of claim 1 wherein the patterned piezoelectric film comprises gallium arsenide.

4. The electrically switched superconductor of claim 1 wherein the substrate is a semiconductor substrate having an area void of superconductor material wherein the area has at least one semiconductor device.

5. A method of electrically switching a superconductor, comprising: providing a superconductor material on a substrate; providing a piezoelectrically active material on the substrate; making electrical contact to the piezoelectrically active material so a high frequency signal may be applied to the piezoelectrically active material; and generating phonons in the superconductor material when the high frequency signal is applied to the piezoelectrically active material.

6. An electrically switched superconductor, comprising: a substrate; a superconductor material positioned on the substrate; electrical contacts on the superconductor material for making electrical contact to the superconductor material; and phonon generating means positioned on the superconductor material which serves to generate phonons in the superconductor material.

7. The electrically switched superconductor of claim 6 wherein the superconductor material is rendered non-superconducting when acoustic phonon energy is applied to the superconducting material.

8. The electrically switched superconductor of claim 6 wherein the superconductor material comprises $YBa_2Cu_3O_{7-x}$.

9. The electrically switched superconductor of claim 6 wherein the phonon generating means comprises gallium arsenide.

10. The electrically switched superconductor of claim 6 wherein the substrate is a semiconductor substrate having an area void of superconductor material positioned on the semiconductor substrate, and wherein the area has semiconductor devices.

* * * * *